United States Patent [19]
Denison et al.

[11] Patent Number: 5,869,149
[45] Date of Patent: Feb. 9, 1999

[54] METHOD FOR PREPARING NITROGEN SURFACE TREATED FLUORINE DOPED SILICON DIOXIDE FILMS

[75] Inventors: Dean R. Denison, San Jose; Ajay Saproo, Mountain View; David T. Hodul, Oakland, all of Calif.

[73] Assignee: Lam Research Corporation, Fremont, Calif.

[21] Appl. No.: 886,148

[22] Filed: Jun. 30, 1997

[51] Int. Cl.⁶ ........................................................ B05D 3/06
[52] U.S. Cl. ......................... 427/579; 427/578; 427/575; 427/571; 427/535
[58] Field of Search ................................... 427/578, 579, 427/535, 539, 575, 571

[56] References Cited

U.S. PATENT DOCUMENTS

| | | |
|---|---|---|
| 3,993,509 | 11/1976 | McGinty . |
| 4,184,188 | 1/1980 | Briglia . |
| 4,340,462 | 7/1982 | Koch . |
| 4,384,918 | 5/1983 | Abe . |
| 4,401,054 | 8/1983 | Matsuo et al. . |
| 4,894,352 | 1/1990 | Lane et al. . |
| 4,902,934 | 2/1990 | Miyamura et al. . |
| 4,948,458 | 8/1990 | Ogle . |
| 5,200,232 | 4/1993 | Tappan et al. . |
| 5,429,995 | 7/1995 | Nishiyama et al. . |
| 5,571,576 | 11/1996 | Qian et al. ............................. 427/574 |
| 5,571,578 | 11/1996 | Kaji et al. . |

FOREIGN PATENT DOCUMENTS

| | | |
|---|---|---|
| 0517548 A2 | 12/1992 | European Pat. Off. . |
| 0599730 A2 | 6/1994 | European Pat. Off. . |
| 08-213386 | 8/1996 | Japan . |

OTHER PUBLICATIONS

Preparation of SiOF Films With Low Dielectric Constant by ECR Plasma CVD, T. Fukada et al., (Feb. 21–22, 1995), DUMIC Conference, pp. 43–46.

High Density Plasma Deposition and Deep Submicron Gap Fill With Low Dielectric Constant SiOF Films, L.Q. Qian et al., (Feb. 21–22, 1995), DUMIC Conference, pp. 50–56.

Dual Frequency Plasma CVD Fluorosilicate Glass Water Absorption and Stability, M.J. Shapiro et al., (Feb. 21–22, 1995), DUMIC Conference, pp. 118–123.

(List continued on next page.)

Primary Examiner—Roy V. King
Attorney, Agent, or Firm—Burns, Doane, Swecker & Mathis, L.L.P.

[57] ABSTRACT

A process of preparing a moisture-resistant fluorine containing $SiO_x$ film includes steps of supplying reactant gases containing silicon, oxygen and fluorine into a process chamber and generating plasma in the process chamber, supporting a substrate on a substrate support in the process chamber, depositing a fluorine-containing $SiO_x$ film on the substrate by contacting the substrate with the plasma while maintaining temperature of the film above 300° C., and nitriding an exposed surface of the film with a high density plasma. The silicon and fluorine reactants can be supplied by separate gases such as $SiH_4$ and $SiF_4$ or as a single $SiF_4$ gas and the oxygen reactant can be supplied by a pure oxygen gas. The $SiH_4$ and $SiF_4$ can be supplied in a ratio of $SiH_4/(SiH_4+SiF_4)$ of no greater than 0.5. The process can provide a film with a fluorine content of 2 to 12 atomic percent and argon can be included in the plasma to assist in gap filling. The plasma can be a high density plasma produced in an ECR, TCP™ or ICP reactor and the substrate can be a silicon wafer including one or more metal layers over which the fluorine-containing $SiO_x$ film is deposited. The substrate support can include a gas passage which supplies a temperature control gas into a space between opposed surfaces of the substrate and the substrate support for maintaining the substrate at a desired temperature. The nitriding step can be carried out in less than 1 minute without applying an rf bias to the substrate. The nitriding gas can be $N_2$, $N_2O$ and/or $NH_3$, the nitrogen ion energy can be 20 to 50 eV, the nitrogen flux can be at least 1 $mA/cm^2$ and the nitrogen gas flow rate can be at least 50 sccm.

17 Claims, 5 Drawing Sheets

OTHER PUBLICATIONS

Comparison of PECVD F–TEOS Films and High Density Plasma SiOF Films, D. Carl et al., (Jun. 27–29, 1995), VMIC Conference, pp. 97–103.

Water–absorption Mechanisms of F–doped PECVD $SiO_2$ with Low–dielectric Constant, H. Miyajima et al., (Jun. 27–29, 1995), VMIC Conference, pp. 391–393.

Controlling Fluorine Concentration and Thermal Annealing Effect on Liquid–Phase Deposited $SiO_{2-x}F_x$ Films, Ching–Fa Yeh et al., (Oct. 1995), J. Electrochem Soc., vol. 142, No. 10, pp. 3579–3593.

*An Evaluation of Fluorine Doped Peteos on Gap Fill Ability and Film Characterization*, K. Hewes et al.

Lim et al, Jpn. J. Appl. Phys., Part 1, 35(2B), 1996, pp. 1468–1473.

Lee et al, Mater Res. Soc. Symp. Proc., 443 (Low–Dielectric Constant Materials II), 1997, pp. 119–125.

METHOD FOR PREPARING NITROGEN SURFACE TREATED FLUORINE DOPED SILICON DIOXIDE FILMS

FIELD OF THE INVENTION

The invention relates to the surface treatment and deposition of fluorine doped silicon dioxide films having improved stability.

BACKGROUND OF THE INVENTION

CVD apparatus is conventionally used to form various thin films in a semiconductor integrated circuit. Such CVD apparatus can form thin films such as $SiO_2$, $Si_3N_4$, Si or the like with high purity and high quality. In the reaction process of forming a thin film, a reaction vessel in which semiconductor substrates are arranged can be heated to a high temperature condition of 500° to 1000° C. Raw material to be deposited can be supplied through the vessel in the form of gaseous constituents so that gaseous molecules are thermally disassociated and combined in the gas and on a surface of the substrates so as to form a thin film.

A plasma-enhanced CVD apparatus utilizes a plasma reaction to create a reaction similar to that of the above-described CVD apparatus, but at a relatively low temperature in order to form a thin film. The plasma CVD apparatus includes a process chamber consisting of a plasma generating chamber which may be separate from or part of a reaction chamber, a gas introduction system, and an exhaust system. For example, such a plasma-enhanced CVD apparatus is disclosed in U.S. Pat. No. 4,401,504 and commonly-owned U.S. Pat. No. 5,200,232. Plasma is generated in such an apparatus by a high density microwave discharge through electron-cyclotron resonance (ECR). A substrate table is provided in the reaction chamber, and plasma generated in the plasma formation chamber passes through a plasma extracting orifice so as to form a plasma stream in the reaction chamber. The substrate table may include a radiof-requency (rf) biasing component to apply an rf bias to the substrate and a cooling mechanism in order to prevent a rise in temperature of the substrate due to the plasma action.

A plasma apparatus using high density ECR for various processes such as deposition, etching and sputtering to manufacture semiconductor components is disclosed in U.S. Pat. No. 4,902,934. Such a plasma apparatus includes an electrostatic chuck (ESC) for holding a substrate (such as a silicon wafer) in good thermal contact and in a vertical orientation. The chuck can also be provided with cooling and heating capabilities. In general, such reaction chambers can be operated under vacuum conditions, and the plasma generation chamber can be enclosed by walls which are water-cooled. Other types of reactors in which deposition can be carried out include parallel plate reactors and high density transformer coupled plasma (TCP™), also called inductively coupled plasma (ICP), reactors of the type disclosed in commonly owned U.S. Pat. Nos. 4,340,462 and 4,948,458.

Electrostatic chucking devices are disclosed in U.S. Pat. Nos. 3,993,509; 4,184,188; and 4,384,918. With such systems, a wafer substrate is typically located on a dielectric layer, and the wafer supporting surface of such electrostatic chucking arrangements can be larger or smaller than the wafer substrate supported thereon. The electrostatic voltage and rf bias are applied to an electrode buried within a dielectric layer and proximate to the wafer/substrate contact surface.

In semiconductor processing, devices are being built with smaller wiring pitches and larger interconnect resistances. In order to reduce delays in critical speed paths, it has been proposed to embed low dielectric constant material between adjacent metal lines or lower the dielectric constant of the intermetal dielectric material by adding fluorine thereto. A paper presented at the Feb. 21–22, 1995 DUMIC Conference by L. Qian et al., entitled "High Density Plasma Deposition and Deep Submicron Gap Fill with Low Dielectric Constant SiOF Films" describes deposition of up to 10 atomic % fluorine-containing moisture resistant SiOF films on a silicon sample at room temperature using high density plasma. This paper states that fluorine in the film can be reduced by adding hydrogen to the $SiF_4+O_2+Ar$ deposition gas chemistry, the film had a dielectric constant of 3.7, and the refractive index was lowest for deposition conditions where the $SiF_4$:$SiF_4+O_2$ ratio was 0.29.

Another paper presented at the DUMIC Conference is by D. Schuchmann et al., entitled "Comparison of PECVD F-TEOS Films and High Density Plasma SiOF Films." This paper mentions that fluorinated TEOS films have been used for gap filling and compares such films to films deposited by high density plasma (HDP) inductively coupled plasma using $SiF_4+O_2+Ar$. The HDP films were found to have better moisture and thermal stability than the F-TEOS films.

Other papers presented at the DUMIC Conference include "Preparation of SiOF Films with Low Dielectric Constant by ECR Plasma CVD" by T. Fukada et al., "An Evaluation of Fluorine Doped PETEOS on Gap Fill Ability and Film Characterization" by K. Hewes et al., "Dual Frequency Plasma CVD Fluorosilicate Glass Water Absorption and Stability" by M. Shapiro et al., and "Water-absorption mechanisms of F-doped PECVD $SiO_2$ with Low-Dielectric Constant" by H. Miyajima et al. Of these, Fukada discloses that SiOF films deposited by rf biased ECR plasma are superior to SOG and TEOS-$O_3$ films, the SiOF films providing excellent planarization and sub half micron gap filling without voids. Moreover, according to Fukada, the dielectric constant of SiOF films can be reduced from 4.0 to 3.2 by increasing the $SiF_4/(SiF_4+SiH_4)$ gas flow ratio in an rf-biased ECR plasma CVD process using $SiF_4$, $SiH_4$ and $O_2$ gas reactants ($O_2/(SiF_4+SiH_4)$=1.6) and a substrate held on a water cooled electrostatic chuck. Hewes discloses CVD of fluorosilicate glass films from TEOS, $O_2$ and $C_2F_6$ introduced into a reaction chamber by a showerhead gas mixer. Shapiro discloses that ULSI device speed can be increased by reducing capacitance of the interlevel insulator such as by adding fluorine to $SiO_x$ films but water incorporation into the films raises the dielectric constant and water evolution can produce voids or corrosion in surrounding metal. Miyajima discloses that water absorption of F-doped $SiO_2$ films containing more than 4% F is a serious problem because it causes degradation of device reliability and film adhesion properties and that the resistance to water absorption is lower for films deposited by parallel plate plasma CVD compared to high density helicon-wave plasma using TEOS, $O_2$ and $CF_4$ as deposition gases.

The effects of thermal annealing on the densification of $SiO_2$ prepared by liquid-phase deposition at 15° C. is described by C. Yeh et al., in "Controlling Fluorine Concentration and Thermal Annealing Effect on Liquid-Phase Deposited $SiO_{2-x}F_x$ Films", J. Electrochem, Vol. 142, No. 10, October 1995. Yeh discloses that restructuring occurs during annealing because H atoms between F and O atoms are very electronegative and annealing at 300° to 500° C. can break SiO—H bonds forming $SiO^-$ whereas annealing higher than 700° C. also breaks SiF bonds forming $Si^+$.

As integrated circuits become smaller and faster, there is a need to reduce the dielectric constant of the intermetal dielectric to prevent degradation of the pulse propagation and to reduce the device power consumption. One technique for achieving dielectric constant as low as 3.4 is by the addition of fluorine to $SiO_2$. Fluorine doped $SiO_2$ is commonly referred to as "FSG." FSG can be obtained in several ways such as by the addition of $C_2F_6$ to a TEOS (tetraethoxysilane)/$O_2$ deposition process or by plasma deposition using a mixture of $SiF_4$/$O_2$ or a mixture of $SiF_4$, $SiH_4$ and $O_2$.

The preferred method of FSG deposition utilizes a high density plasma source because of its demonstrated superiority in the gap filling of narrow, high aspect gaps between adjacent metal lines. One negative feature common to FSG processes is that the resulting dielectric material is hydrophilic, i.e. it absorbs moisture from the atmosphere via SiOH bonding which can result in a time dependent increase in the dielectric constant referred to as "drift." This dielectric constant drift is referred to as film instability.

As disclosed in copending application Ser. No. 08/604,018, film stability can be improved by carrying out the deposition at a process temperature greater than 300° C. with $SiF_4$ constituting more than 50% of the silicon bearing deposition gas. Although the film stability can be greatly improved, the dielectric constant can increase as much as 0.1 after one week exposure to atmospheric moisture starting from a dielectric constant of 3.5 or less. Such atmospheric exposure could occur as a result of storage time in a semiconductor fab while the wafers wait for the next processing step. For purposes of this discussion, "instability" is defined as the change in dielectric constant, $\Delta k$, when the film is left in air at ambient temperature (e.g. typically 50±10% relative humidity in a fab) for 7 days. The dielectric constant is measured at least five times during the 7 day period and a least squares linear or quadratic fit to the data is used to calculate the drift at 5 days. For stability, this number is preferably less than 0.05.

Takeishi et al. investigated the film stability effects of annealing an oxide film in $N_2O$, $N_2$ and $O_2$ (*J. Electrochem. Soc.*, 143,381 (1996). According to Takeishi et al., the film was heated to 400° C. in a $N_2O$ plasma, an $N_2$ plasma, an $O_2$ plasma and $O_2$ without plasma. The film, deposited from plasma enhanced CVD TEOS/$O_2$ using $C_2F_6$ as the fluorine source, showed some improvement in stability for the nitrogen and $N_2O$ treated films. A major drawback of the Takeishi et al. treatment is that a 30 min. plasma treatment is necessary to achieve stability improvement. Such a lengthy treatment presents serious problems in implementation as a production process using single wafer processing technology.

Hattangady et al. investigated a process for nitriding the surface of a gate oxide by exposing the oxide to a remotely generated He—$N_2$ plasma. According to Hattangady et al., a surface nitridation of an $SiO_2$ film increases with increasing temperature and saturates with a sufficiently long exposure time on the order of about 50 minutes.

SUMMARY OF THE INVENTION

The invention provides a process of preparing a moisture-resistant fluorine-containing $SiO_x$ film, comprising steps of supplying reactant gases containing silicon, oxygen and fluorine into a process chamber and generating plasma in the process chamber, supporting a substrate on a substrate support, and growing a fluorine-containing $SiO_x$ film on the substrate by contacting the substrate with the plasma while maintaining temperature of the film above 300° C., and nitriding an exposed surface of the film.

According to various aspects of the invention, the nitriding can be carried out in less than 1 minute and without applying an rf bias to the substrate. The nitriding can be carried out with a nitrogen-containing gas selected from the group consisting of $N_2$, $N_2O$ and $NH_3$. The nitrogen ion energy during the nitriding step can be 20 to 50 eV, the nitrogen flux can be at least 1 $mA/cm^2$ and the nitrogen flow rate can be at least 50 sccm. Moreover, during the nitriding step the reactants, ratios thereof and/or the temperature of the substrate can be adjusted to enhance properties of the $SiO_x$ film.

The deposition step can be carried out with $SiF_4$ and $SiH_4$ gases or only $SiF_4$ gas and/or the $SiF_4$ and $SiH_4$ gases can be supplied into the process chamber in a ratio of $SiH_4$/($SiH_4+SiF_4$) of no greater than 0.5. The temperature of the deposited film can be controlled as a function of the $SiH_4$/($SiH_4+SiF_4$) ratio. For instance, during the deposition step the temperature of the film can be maintained no lower than 360° C. while maintaining the ratio of $SiH_4$/($SiH_4+SiF_4$) no greater than 0.4 or the temperature of the film can be maintained no lower than 320° C. while maintaining the ratio of $SiH_4$/($SiH_4+SiF_4$) no greater than 0.3.

The deposition process can provide the film with a fluorine content of 2 to 12 atomic %. If desired, the gas may contain one or more additional components such as argon in an amount sufficient to assist in gap filling and/or the plasma can be a high density plasma. Further, the process can be carried out in the process chamber of an ECR or TCP™ (ICP) reactor. The substrate can be a semiconductor wafer and/or the film can be deposited over a metal layer on the substrate. Further, the substrate support can include a gas passage supplying a temperature control gas into a space between opposed surfaces of the substrate and the substrate support.

DETAILED DESCRIPTION OF PREFERRED EMBODIMENTS

According to the invention, silicon nitride is used as an effective moisture barrier despite the fact that silicon nitride's high dielectric constant, 7.5, has precluded its use as an interlayer dielectric. The problem of silicon nitride's high dielectric constant is overcome by controlling process conditions in accordance with the invention. In particular, according to the invention, it is possible to provide an effective nitride encapsulating layer on an oxide film surface without being so thick as to degrade the composite dielectric constant. The encapsulating nitride layer provides improved FSG stability by inhibiting moisture diffusion into the film.

The inventors of the present invention investigated process parameters which could influence the formation of a nitride layer on an FSG film. These process parameters include: high density plasma excitation power, gas flow, substrate bias, film deposition conditions such as temperature, and fluorine content of the film. In the following examples, the nitride layer was formed using an electrocyclotron resonance (ECR) high density plasma source which generated nitrogen ions but similar results can be obtained using other high density plasma sources such as inductively coupled plasma sources. According to the invention, it has been discovered that the use of a high density plasma permits much shorter processing times and it has unexpectedly been discovered that the properties of the nitride film can be improved by adjusting the conditions used for the initial deposition of the oxide film.

According to the invention, it has been unexpectedly discovered that use of higher deposition temperatures before nitridation can provide better film stability after nitridation. Further, due to nitrogen flux to the oxide surface by using the high density plasma process, it was surprisingly found that effective nitridation according to the invention can be achieved in 1 minute or less. The nitrogen ion energy from the high density plasma is preferably on the order of 20 to 50 eV which is much greater than the bond strength of Si—O or Si—F. As such, it is not necessary to apply additional bias to the substrate to increase the ion energy. In fact, another surprising discovery according to the present invention is that increasing the energy above 50 eV degrades the quality of the passivation due to the nitride layer and the stability is worse.

According to the invention, nitridation can be carried out using a nitrogen flux of greater than 1 mA/cm$^2$ current density directed onto the surface of a previously deposited fluorine doped, $SiO_2$ film. The deposition temperature during formation of the previously deposited fluorine $SiO_2$ film is preferably greater than 300° C. The exposure time for the nitridation treatment, in seconds, is preferably on the order of $t=600/I$ where I is the nitrogen flux in mA/cm$^2$, e.g., with a 10 mA/cm$^2$ current density the film exposure time can be on the order of 1 minute. The nitrogen source can comprise a nitrogen-containing source such as $N_2$ or other nitrogen sources such as $N_2O$ and $NH_3$. However, $N_2$ is preferred since it achieves nitridation in shorter times and thus optimizes throughout.

Compared to the previously mentioned publications by Takeishi et al. and Hattangady et al, one advantage of the invention is that it is possible to reduce the drift in the dielectric constant to less than 0.04 in 7 days. In contrast, the Takeishi and Hattangady techniques result in much higher dielectric constant drift of at least 0.10 in 7 days. It should be evident that the invention provides a process that permits greatly improved film stability compared to the prior art. The invention also recognizes that the deposition temperature before nitridation has a substantial effect on film stability. Further, the use of a high density plasma permits the nitridation process according to the invention to take place in 30 seconds instead of the 30 minutes required by the prior art processes.

Fluorine doped films according to the invention have low dielectric constants and are desirable in integrated circuit manufacture wherein substrates such as silicon wafers are coated with metal layers and dielectric intermetal layers. In order to reduce the RC time constant for signal propagation, reduce crosstalk, and reduce power consumption, the fluorine doped silicon dioxide films can have 2 to 12 atomic % fluorine to decrease the inter-electrode capacitance. The nitridation according to the invention provides protection when such films are exposed to moisture such as atmospheric humidity or immersion in liquid such as during chemical/mechanical polishing of the substrates.

According to the invention, the fluorine doped silicon dioxide films can be obtained by high density deposition using a mixture of silane ($SiH_4$), tetrafluorosilane ($SiF_4$) and an oxygen source. The fluorine content and dielectric constant of the deposited film can be controlled by adjusting the ratio of the $SiH_4$ and $SiF_4$. The flux and energy of the oxygen from the plasma also affects the fluorine content and dielectric constant of the deposited film. Optionally, an inert gas such as argon can be added to the gas mixture to assist in gap filling.

In addition to controlling the ratio of reactants, the temperature of the growing film has been found to influence the moisture stability of the deposited film. However, as shown by the following table, the film temperature for achieving moisture stability depends at least in part on the ratio of $SiH_4$ to $SiF_4$. In general, lower film temperatures can be used with low $SiH_4/(SiH_4+SiF_4)$ ratios.

TABLE

| $SiH_4/(SiH_4 + SiF_4)$ Gas Ratio | 280° C. | 320° C. | 360° C. |
|---|---|---|---|
| 0.0 | X | O | O |
| 0.1 | X | O | O |
| 0.2 | x | O | O |
| 0.3 | X | O | O |
| 0.4 | X | X | O |
| 0.5 | X | X | X |

In the above table, X's represent films which are not moisture resistant whereas O's represent moisture resistant films. Thus, it can be seen that it is desirable to maintain the temperature of the growing film above 280° C. and depending on the $SiH_4/(SiH_4+SiF_4)$ ratio it is also desirable to maintain the temperature at 320° C. and above or even 360° C. and above.

The process of the invention is preferably carried out in a high density plasma. Such a high density plasma can be produced in various reactors such as an ECR or TCP™ (ICP) reactor.

Figure 1:
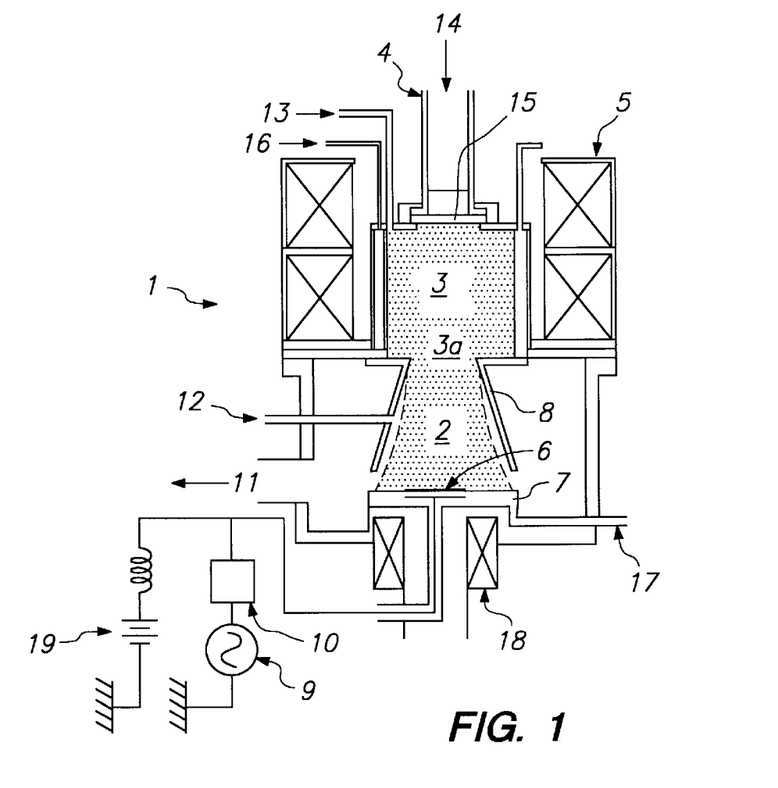
FIG. 1 is a schematic view of a high density plasma ECR reactor which can be used to carry out the process according to the invention.

FIG. 1 shows an ECR reactor 1 which can process a substrate with a high density plasma. The reactor includes a reaction chamber 2 wherein a substrate is subjected to treatment with a plasma gas. In order to generate the high density plasma, the reactor includes a plasma generating chamber 3 wherein a high density plasma is generated by the combination of microwave energy transmitted through microwave guide 4 and magnetic energy generated by electromagnetic coils 5. The high density plasma can be generated from a suitable gas or gas mixture such as oxygen and/or argon and an ion beam is extracted from the plasma chamber though orifice 3a. A substrate 6 is supported on a substrate support 7 such as an electrostatic chuck having a substrate temperature controlling mechanism associated therewith.

The high density plasma generated in chamber 3 can be confined within horn 8 and directed to the substrate 6 by applying an rf bias to the substrate by means of an rf source 9 and associated circuitry 10 for impedance matching, etc. The reaction chamber 2 is evacuated by a suitable vacuum arrangement represented generally by the evacuation port 11. In order to introduce one or more silicon and/or fluorine containing reactants into the high density plasma, the horn 8 can include one or more gas injection arrangements such as gas distributing rings on the inner periphery thereof whereby reactants such as $SiH_4$ and $SiF_4$ can be introduced into the high density plasma. The reactant or reactants can be supplied through one or more passages represented generally at 12. In order to produce a plasma in plasma generating chamber 3, oxygen and argon can be introduced into the plasma generating chamber 3 by one or more passages represented generally at 13.

Microwave energy represented by arrow 14 travels through dielectric window 15 and enters the plasma generating chamber 3, the walls of which are water cooled by water supply conduit 17. Electromagnetic coils 18 below substrate holder 7 are used for shaping the magnetic field in the vicinity of the substrate 6. A DC power source 19 provides power to the substrate holder 7 for electrostatically clamping substrate 6.

Figure 2:
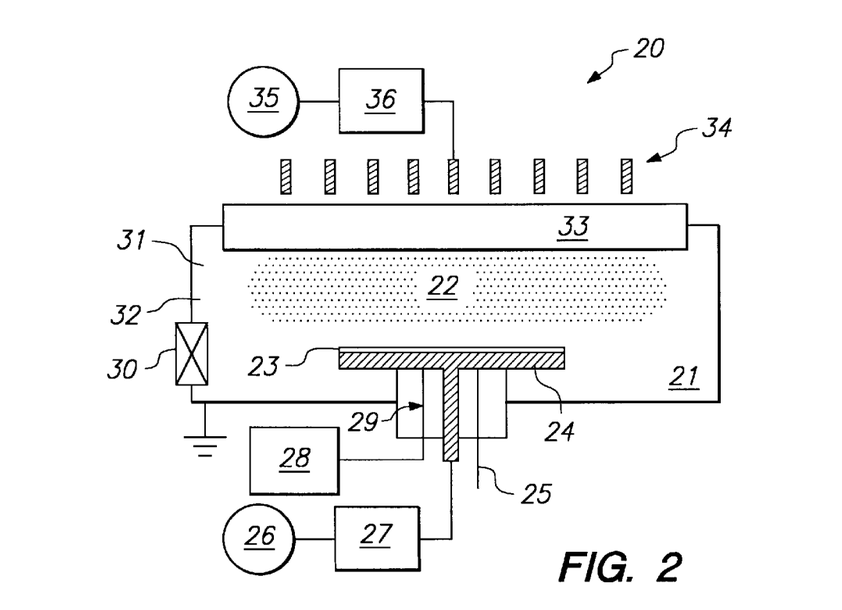
FIG. 2 is a schematic of a high density plasma TCP™ reactor which can be used to carry out the process according to the invention.

FIG. 2 shows a TCP™ reactor 20 which can process substrates with high density plasma. The reactor includes a process chamber 21 in which plasma 22 is generated adjacent substrate 23. The substrate is supported on water cooled substrate support 24 and temperature control of the substrate is achieved by supplying helium gas through conduit 25 to a space between the substrate and the substrate support. The substrate support can comprise an aluminum electrode or a ceramic material having a buried electrode therein, the electrode being powered by an rf source 26 and associated circuitry 27 for providing rf matching, etc. The temperature of the substrate during processing thereof is monitored by temperature monitoring equipment 28 attached to temperature probe 29.

In order to provide a vacuum in chamber 21, a turbo pump is connected to outlet port 30 and a pressure control valve can be used to maintain the desired vacuum pressure. Reactants such as oxygen and silane can be supplied into the chamber by conduits 31, 32 which feed the reactant gases to a gas distribution ring extending around the underside of dielectric window 33 or the reactants can be supplied through a dielectric showerhead window. A TCP™ coil 34 located outside the chamber in the vicinity of the window is supplied rf power by rf source 35 and associated circuitry 36 for impedance matching, etc. When a substrate is processed in the chamber, the rf source 35 supplies the TCP™ coil 34 with rf current at 13.56 MHz and the rf source 26 supplies the lower electrode with rf current at 400 kHz.

The following examples illustrate various aspects of the invention.

Example 1

Nitridation of FSG films was carried out to determine stability data for the $N_2$ plasma treatment according to the invention. This experiment was performed to determine the effects of exposure time and rf bias on film stability. The FSG film was obtained according to a standard process carried out in an ECR reactor using 1700 watts microwave power, 2400 watts rf bias, 80 sccm $SIF_4$, 104 sccm $O_2$, 40 sccm Ar, 600 volts electrostatic chuck clamping voltage, and main field coil current, mirror current and cusp current at 61 amps, 53 amps and 47 amps, respectively. The results of these nitridation tests are set forth in the following Table 2:

TABLE 2

| Wafer # | Exposure time (sec) | rf Bias (W) | Δk |
|---|---|---|---|
| 1 | 60 | 0 | 0.042 |
| 2 | 60 | 0 | 0.031 |
| 3 | 60 | 500 | 0.065 |
| 4 | 60 | 1000 | 0.076 |
| 5 | 120 | 0 | 0.012 |
| 6 | 120 | 500 | 0.050 |
| 7 | 120 | 1000 | 0.056 |
| 8 | 180 | 0 | 0.022 |
| 9 | 180 | 500 | 0.061 |
| 10 | 180 | 1000 | 0.089 |

These wafers were allowed to sit in ambient air for one week and the change in dielectric constant, Δk, was measured. Wafers 1, 2, 5 and 8 showed no drift but the others had drift>0.1. For comparison, FSG films deposited at temperatures of 290° C., 320° C. and 350° C. but not subjected to nitridation have been found to exhibit drifts of 0.20, 0.17 and 0.09, respectively.

Example 2

In another experiment, tests were carried out to determine the dependence of the moisture barrier stability on microwave power, $N_2$ flow, and the deposition temperature of the FSG film prior to the plasma treatment. The results of these tests are set forth in the following Table 3:

TABLE 3

| Wafer | Microwave Power (W) | Nitrogen Flow (sccm) | Temperature (°C.) | Δk |
|---|---|---|---|---|
| 1 | 1700 | 150 | 320 | 0.080 |
| 2 | 1700 | 50 | 350 | 0.058 |
| 3 | 1700 | 250 | 350 | 0.031 |
| 4 | 1300 | 50 | 290 | 0.206 |
| 5 | 1700 | 250 | 290 | 0.095 |
| 6 | 1300 | 150 | 320 | 0.146 |
| 7 | 1300 | 50 | 350 | 0.136 |
| 8 | 1500 | 150 | 320 | 0.103 |
| 9 | 1500 | 150 | 320 | 0.128 |
| 10 | 1300 | 250 | 350 | 0.111 |
| 11 | 1500 | 150 | 350 | 0.124 |
| 12 | 1500 | 150 | 320 | 0.150 |
| 13 | 1500 | 250 | 320 | 0.150 |
| 14 | 1500 | 150 | 290 | 0.202 |
| 15 | 1500 | 150 | 320 | 0.142 |
| 16 | 1500 | 150 | 320 | 0.154 |
| 17 | 1500 | 150 | 320 | 0.142 |
| 18 | 1700 | 50 | 290 | 0.249 |
| 19 | 1300 | 250 | 290 | 0.200 |
| 20 | 1500 | 50 | 320 | 0.181 |

Figure 3:
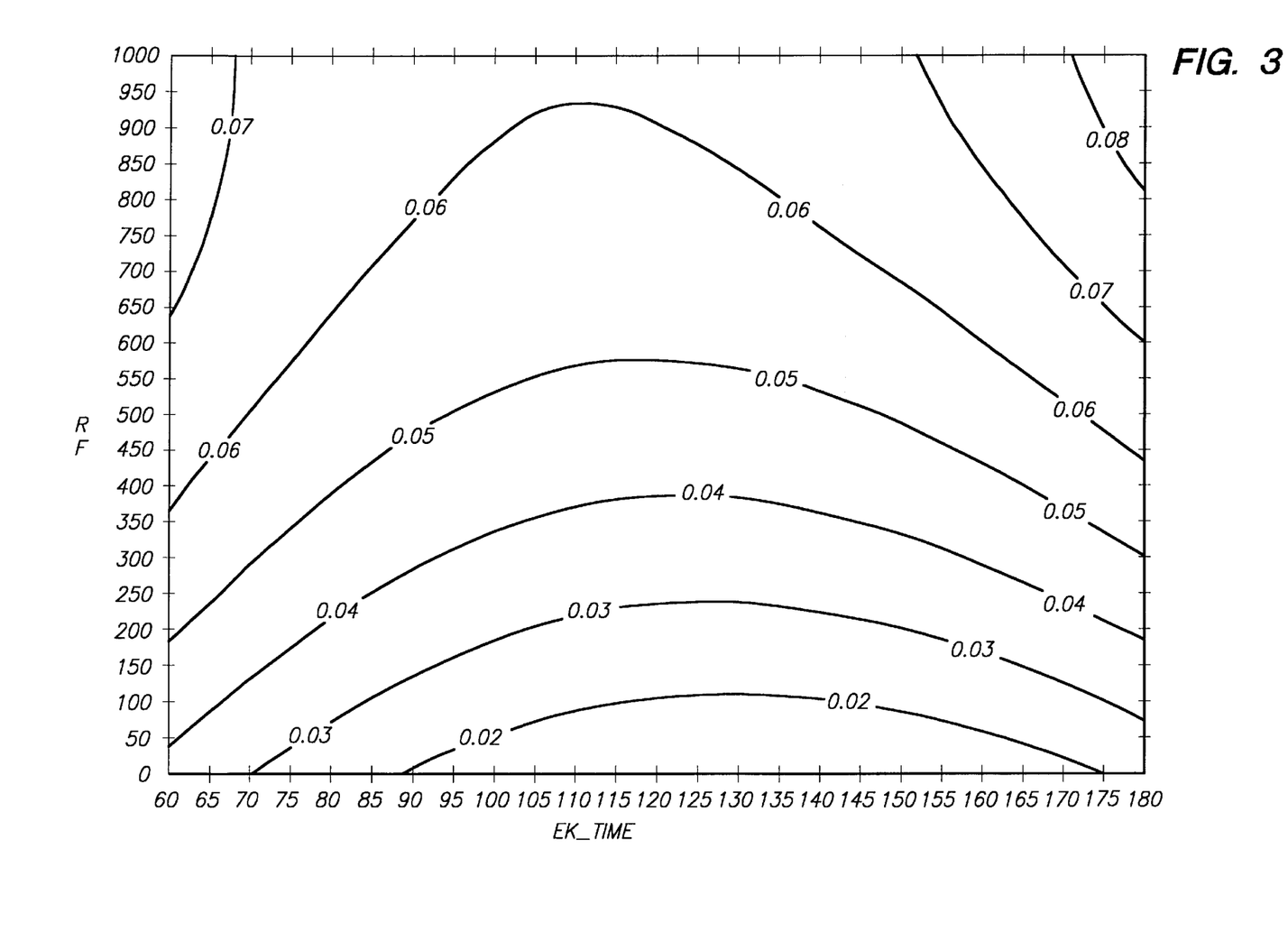
FIG. 3 shows a graph of $\Delta k$ versus exposure time to nitriding plasma and rf power.
Figure 4:
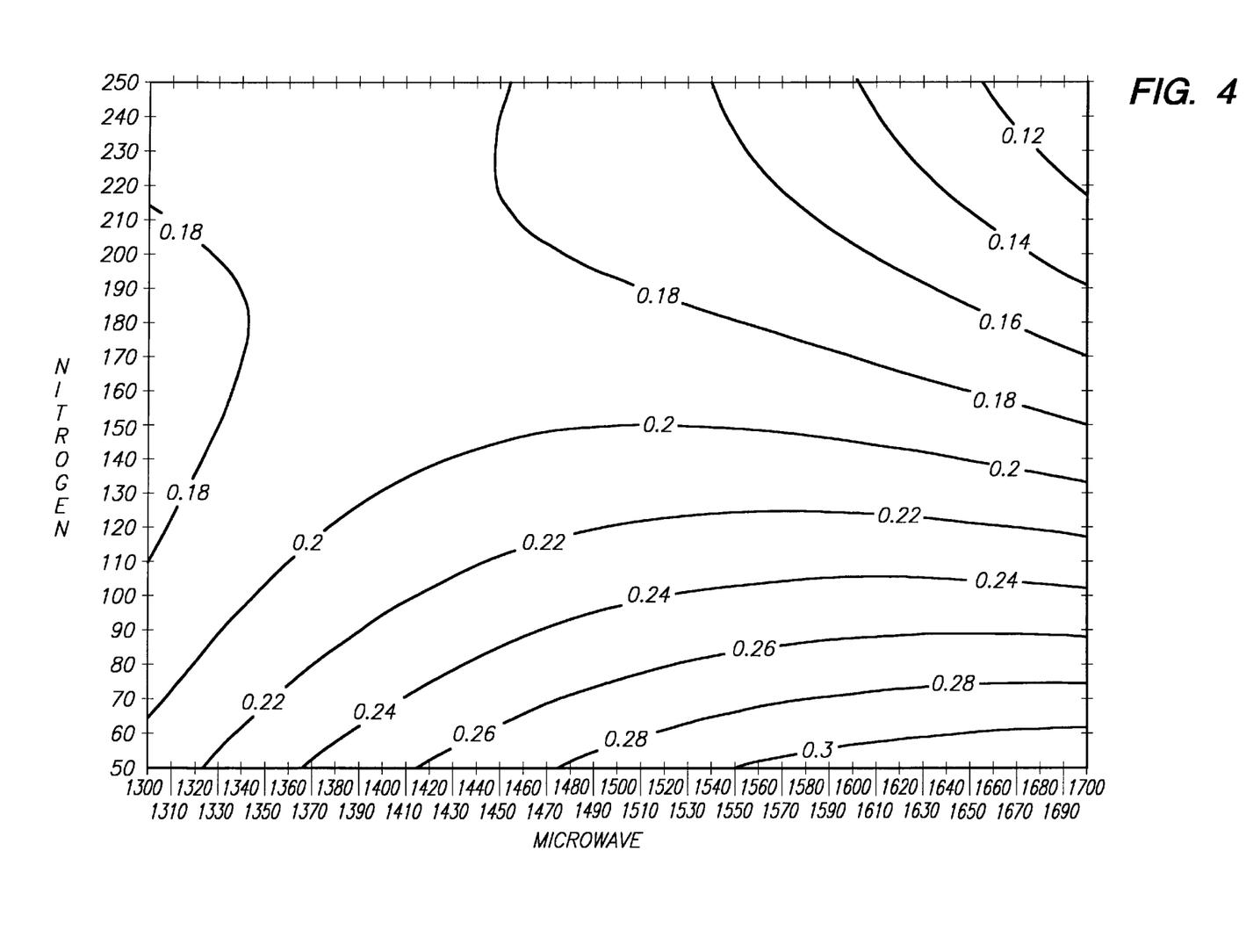
FIG. 4 shows a graph of $\Delta k$ versus microwave power and nitrogen flow during nitriding of FSG film previously deposited at 290° C.
Figure 5:
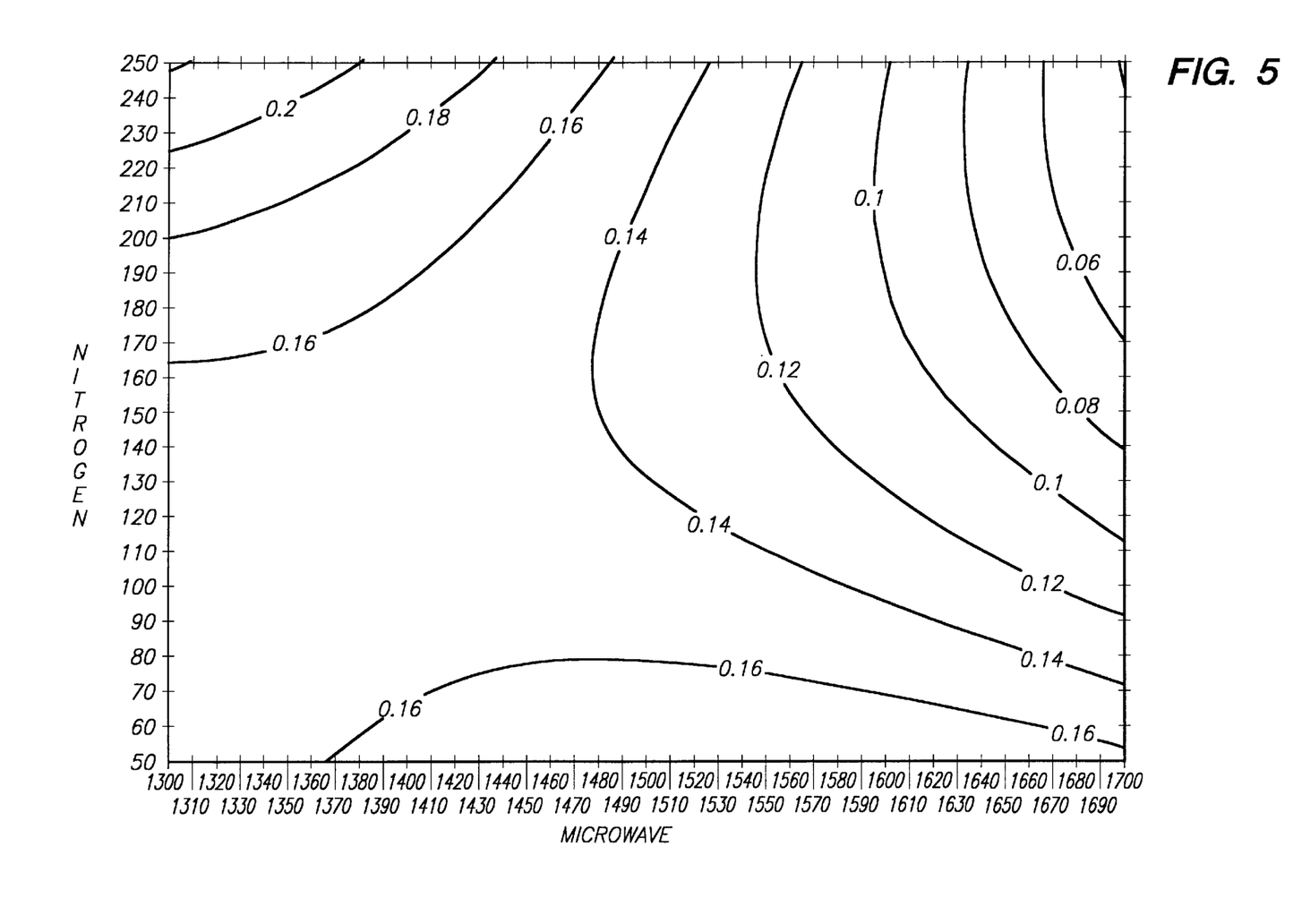
FIG. 5 shows a graph of $\Delta k$ versus microwave power and nitrogen flow during nitriding of FSG film previously deposited at 320° C.
Figure 6:
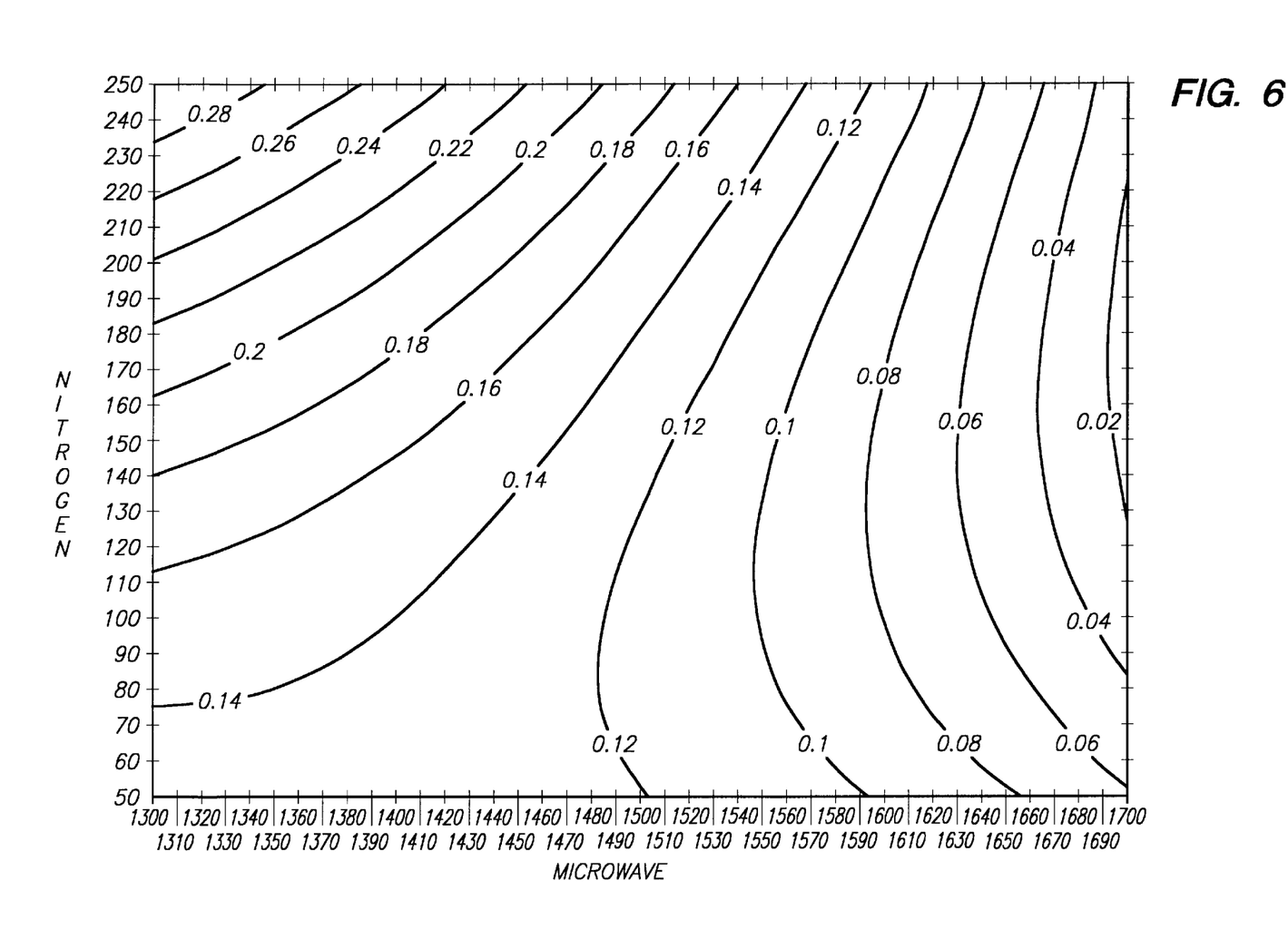
FIG. 6 shows a graph of $\Delta k$ versus microwave power and nitrogen flow during nitriding of FSG film previously deposited at 350° C.

The results set forth in Table 2 and shown in FIG. 3 show that low energy flux provides better moisture stability. In fact, the application of any rf bias degrades the effectiveness of the nitride layer. The results set forth in Table 3 show that the nitrogen flux needs to be as high as possible (highest microwave power and highest nitrogen gas flow) and surprisingly and unexpectedly the deposition temperature of the film, before any plasma treatment, should be as high as possible, e.g., preferably higher than 320° C. FIGS. 4–6 show that the Δk stability value improves with increasing FSG deposition temperature, decreasing rf bias, increasing nitrogen flow and/or increasing microwave power.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A process of preparing a moisture-resistant fluorine-containing $SiO_x$ film, comprising the steps of:

supplying reactant gases containing silicon, oxygen and fluorine into a process chamber and generating plasma in the process chamber;

supporting a substrate on a substrate support;

depositing a fluorine-containing $SiO_x$ film on the substrate by contacting the substrate with the plasma while maintaining temperature of the fluorine-containing $SiO_x$ film above 300° C.; and nitriding an exposed surface of the fluorine-containing $SiO_x$ film by contacting the surface with a high density plasma, the fluorine-containing $SiO_x$ film exhibiting a change in dielectric constant $\Delta k$ after one week in atmospheric air at ambient temperature of <0.1.

2. The process of claim 1, wherein the nitriding is carried out in less than 1 minute and without applying an rf bias to the substrate.

3. The process of claim 1, wherein the nitriding is carried out with a nitrogen-containing gas selected from the group consisting of $N_2$, $N_2O$ and $NH_3$.

4. The process of claim 1, wherein the nitriding is carried out with a nitrogen ion energy of 20 to 50 eV.

5. The process of claim 1, wherein the nitriding is carried out with a nitrogen flux of at least 1 $mA/cm^2$.

6. The process of claim 1, wherein the nitriding is carried out with a nitrogen flow rate of at least 50 sccm.

7. The process of claim 1, wherein the reactant gases used in depositing the fluorine-containing $SiO_x$ film include $SiF_4$ and $SiH_4$ gases and the $SiF_4$ and $SiH_4$ gases are supplied into the process chamber in a ratio of $SiH_4/(SiH_4+SiF_4)$ of no greater than 0.5.

8. The process of claim 1, wherein the temperature of the fluorine-containing $SiO_x$ film during the step of depositing the fluorine-containing $SiO_x$ film is at least 350° C.

9. The process of claim 1, wherein during the depositing step the temperature of the fluorine-containing $SiO_x$ film is maintained no lower than 320° C. and the ratio of $SiH_4/(SiH_4+SiF_4)$ is no greater than 0.4.

10. The process of claim 1, wherein the fluorine-containing $SiO_x$ film has a fluorine content of 2 to 12 atomic %.

11. The process of claim 1, wherein the fluorine-containing $SiO_x$ $SiO_x$ film is deposited in gaps between electrically conductive lines on the substrate, the reactant gases including argon in an amount sufficient to assist in gap filling.

12. The process of claim 1, wherein the depositing step is carried out while applying an rf bias to the substrate and the entire process is carried out in the process chamber of an ECR reactor.

13. The process of claim 1, wherein the entire process is carried out in the process chamber of a an ICP reactor.

14. The process of claim 1, wherein the substrate is a semiconductor wafer.

15. The process of claim 1, wherein the fluorine-containing $SiO_x$ film is deposited over a metal layer.

16. The process of claim 1, wherein the substrate support includes a gas passage supplying a temperature control gas into a space between opposed surfaces of the substrate and the substrate support.

17. The process of claim 1, wherein the fluorine-containing $SiO_x$ film exhibits a change in dielectric constant $\Delta k$ after 1 week in atmospheric air at ambient temperature of <0.05.

* * * * *